(12) United States Patent
Liao et al.

(10) Patent No.: US 8,288,231 B1
(45) Date of Patent: Oct. 16, 2012

(54) METHOD OF FABRICATING A RECESSED CHANNEL ACCESS TRANSISTOR DEVICE

(75) Inventors: Wei-Ming Liao, Taoyuan County (TW); Ming-Cheng Chang, New Taipei (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 13/212,209

(22) Filed: Aug. 18, 2011

(51) Int. Cl.
*H01L 21/336* (2006.01)

(52) U.S. Cl. .................. 438/270; 257/E27.091

(58) Field of Classification Search .......... 438/270, 438/259; 257/E27.091, E27.095
See application file for complete search history.

(56) References Cited

U.S. PATENT DOCUMENTS

| | | | |
|---|---|---|---|
| 7,368,769 B2 * | 5/2008 | Paik | 257/243 |
| 7,902,027 B2 * | 3/2011 | Yamamoto | 438/270 |
| 2006/0017099 A1 * | 1/2006 | Paik | 257/330 |
| 2006/0199335 A1 * | 9/2006 | Rao et al. | 438/258 |
| 2008/0042195 A1 * | 2/2008 | Yamamoto | 257/333 |
| 2011/0124173 A1 * | 5/2011 | Kim et al. | 438/305 |

* cited by examiner

*Primary Examiner* — Thao P. Le
(74) *Attorney, Agent, or Firm* — Winston Hsu; Scott Margo (57) ABSTRACT

A method of fabricating a recessed channel access transistor device is provided. First, a semiconductor substrate having thereon a recess etched into a major surface is provided. A gate dielectric layer is then formed on interior surface of the recess. A recessed gate electrode is then formed in and on the recess. The recessed gate electrode comprises a recessed gate portion that is inlaid into the recess and under the major surface, and an upper gate portion above the major surface. An exposed sidewall of the recessed gate electrode is isotropically etched to thereby form a trimmed neck portion having a width that is smaller than that of the recessed gate portion. An exposed sidewall of the trimmed neck portion is then oxidized.

7 Claims, 7 Drawing Sheets

METHOD OF FABRICATING A RECESSED CHANNEL ACCESS TRANSISTOR DEVICE

BACKGROUND OF THE INVENTION

1. Field of the Invention

The present invention relates generally to semiconductor devices and a method of fabricating the same. More particularly, the present invention relates to a method of fabricating a recessed channel access transistor (RCAT) device with reduced GIDL (gate induced drain leakage). The invention is particularly suited for high-density dynamic random access memory (DRAM) applications.

2. Description of the Prior Art

As the size of semiconductor devices shrinks, the gate channel length decreases correspondingly. Consequently, a short channel effect may occur. The conventional method of solving the short channel effect includes decreasing the thickness of the gate oxide layer or increasing concentration of the dopants. These methods, however, may deteriorate the reliability of the devices and decrease the speed of transferring data.

In the last few years, recessed channel access transistor devices (or RCAT devices in short) have been developed to suppressing the short channel effect by physically increasing the gate channel length without an increase in a lateral area of a gate electrode. The RCAT transistor has a gate oxide layer formed on sidewalls and the bottom surface of a recess etched into a substrate, where a conductive substance fills the recess, contrary to a planar gate type transistor having a gate electrode formed on a planar surface of a substrate. Therefore, the integration of the recessed-gate transistor can be increased.

However, in a conventional RCAT device, when a drain voltage (Vd) is applied to a capacitor that is electrically connected to an NMOS transistor, a gate induced drain leakage (GIDL) problem may occur. A sharp upper corner of the poly gate and the relative thinner gate oxide layer near the sharp corner of the poly gate result in a concentrated electric field at the cell side of a DRAM cell. The concentrated electric field leads to the leakage. The GIDL adversely affects the refresh characteristic of the DRAM device. Therefore, it is desirable to remove or alleviate the GIDL in the RCAT device in order to improve the refresh characteristic of the DRAM device.

SUMMARY OF THE INVENTION

It is therefore one objective of the present invention to provide an improved method of fabricating a recessed channel access transistor (RCAT) device with reduced GIDL.

According to one embodiment of this invention, a method of fabricating a recessed channel access transistor device is provided. First, a semiconductor substrate having thereon a recess etched into a major surface is provided. A gate dielectric layer is then formed on interior surface of the recess. A recessed gate electrode is then formed in and on the recess. The recessed gate electrode comprises a recessed gate portion that is inlaid into the recess and under the major surface, and an upper gate portion above the major surface. An exposed sidewall of the recessed gate electrode is isotropically etched to thereby form a trimmed neck portion having a width that is smaller than that of the recessed gate portion. An exposed sidewall of the trimmed neck portion is then oxidized.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings, which form a part hereof, and in which is shown by way of illustration specific examples in which the embodiments may be practiced. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

With regard to the fabrication of transistors and integrated circuits, the term "major surface" refers to that surface of the semiconductor layer in and about which a plurality of transistors are fabricated, e.g., in a planar process. As used herein, the term "vertical" means substantially orthogonal with respect to the major surface. Typically, the major surface is along a <100> plane of a monocrystalline silicon layer on which the field-effect transistor devices are fabricated.

Figure 1:
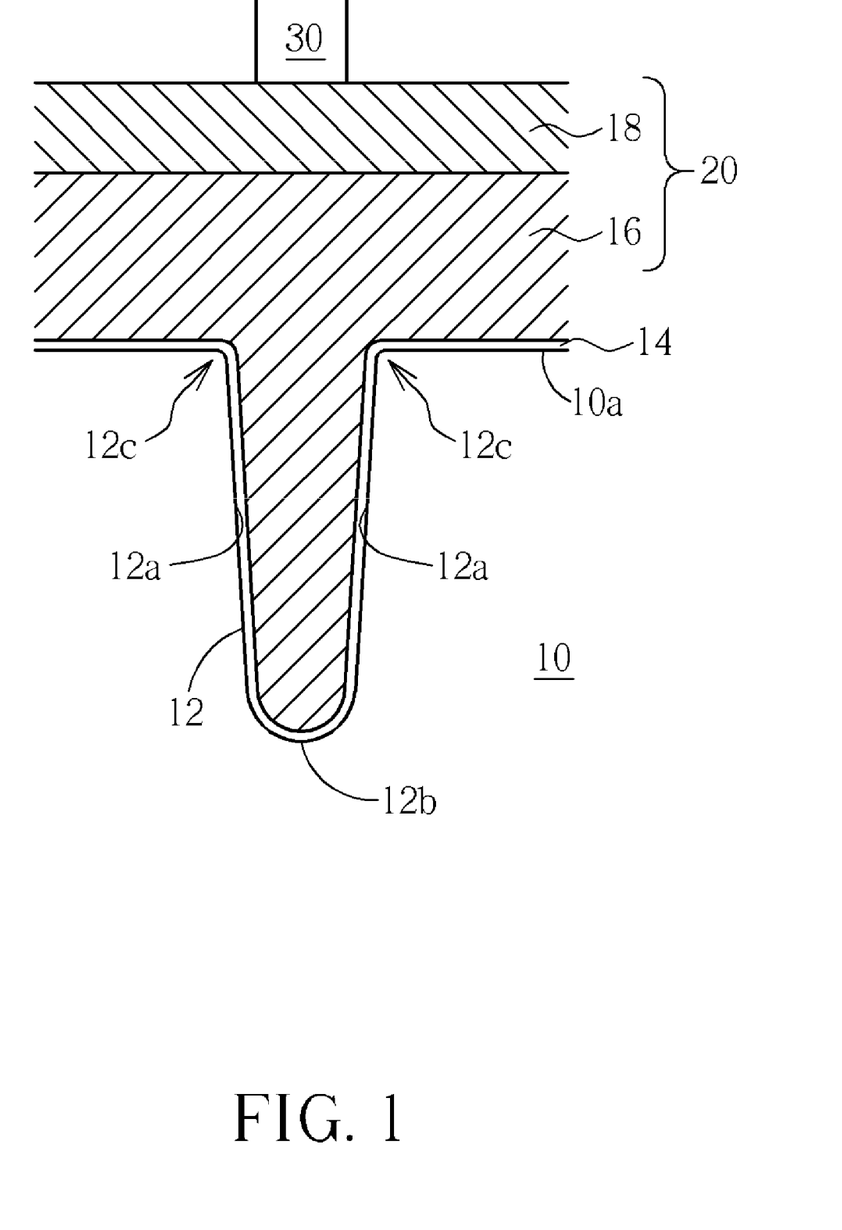
FIGS. 1-6 are schematic, cross-sectional diagrams showing an exemplary method for fabricating a recessed channel access transistor (RCAT) device with reduced GIDL (gate induced drain leakage) in accordance with one embodiment of the present invention.

FIGS. 1-6 are schematic, cross-sectional diagrams showing an exemplary method for fabricating a recessed channel access transistor (RCAT) device with reduced GIDL (gate induced drain leakage) in accordance with one embodiment of the present invention. As shown in FIG. 1, a semiconductor substrate 10 such as a silicon substrate or a substrate containing a silicon layer is provided. The semiconductor substrate 10 has a major surface 10a and has at least one recess 12 etched into the major surface 10a of the semiconductor substrate 10. The recess 12 may have a sidewall 12a having a straight and smooth sidewall profile, a curved bottom 12b, and an upper corner 12c about the major surface 10a.

After the formation of the recess 12, a gate dielectric layer 14 such as silicon oxide or high-k oxide is formed on the interior surface including the sidewall 12a, the bottom 12b of the recess 12. The gate dielectric layer 14 also overlies the major surface 10a. Subsequently, a conductive gate material layer 20 is deposited into the recess 12 and completely fills the recess 12. According to the embodiment, the conductive gate material layer 20 comprises a first layer 16 and a second layer 18. For example, the first layer 16 may comprise polysilicon and the second layer 18 may comprise metals, metal alloys, or salicide. However, it is to be understood that the conductive gate material layer 20 may be a single-layer structure or a multi-layer structure without departing from the spirit of the invention. Thereafter, a patterned photoresist mask 30 is formed on the conductive gate material layer 20.

Figure 2:
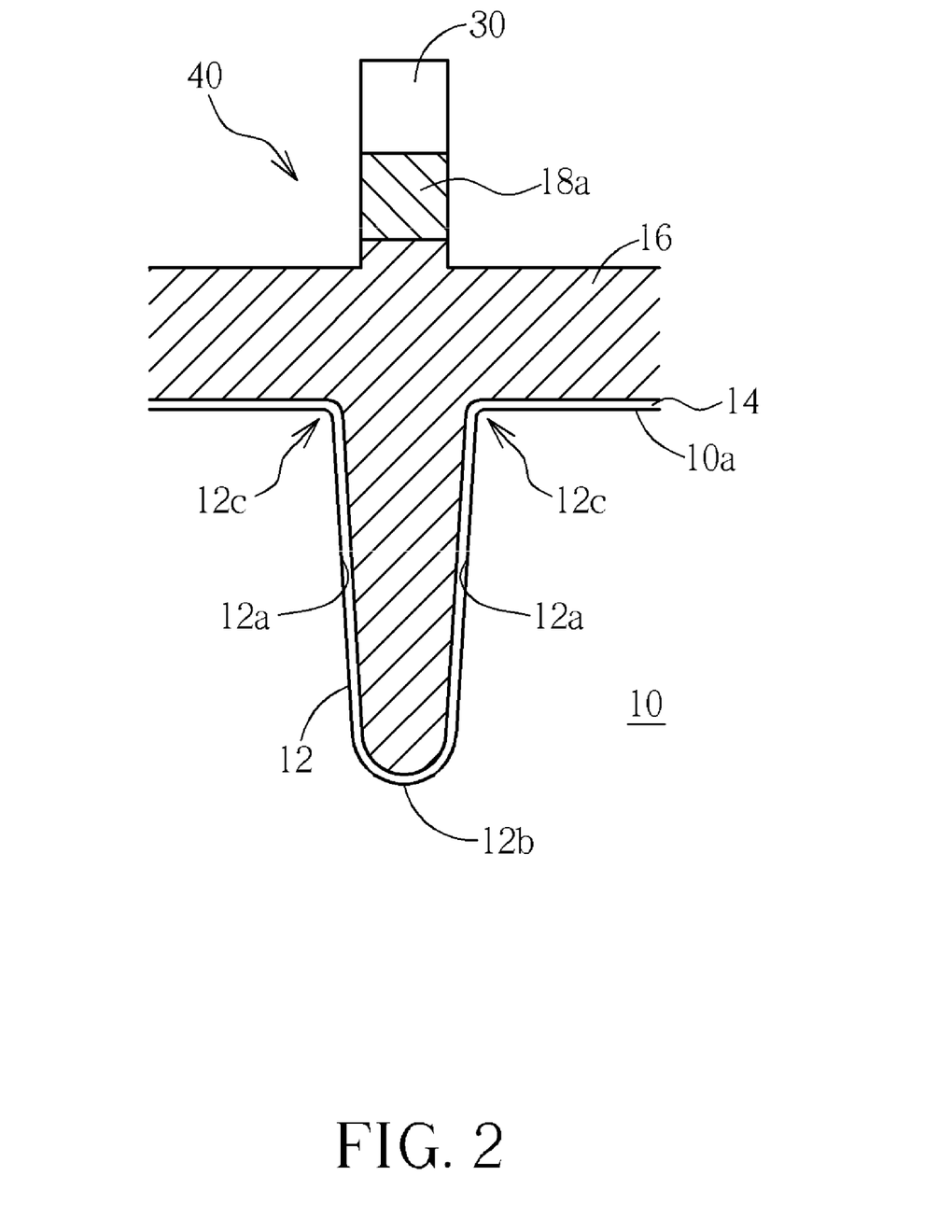

As shown in FIG. 2, after the formation of the patterned photoresist mask 30, an anisotropic dry etching process is performed to etch the conductive gate material layer 20 that is not covered by the patterned photoresist mask 30. More specifically, according to the embodiment, the portion of the second layer 18 that is not covered by the patterned photoresist mask 30 is completely etched away. The anisotropic dry etching process stops upon the exposure of the first layer 16. Optionally, an over-etch process may be carried out after the exposure of the first layer 16.

Figure 3:
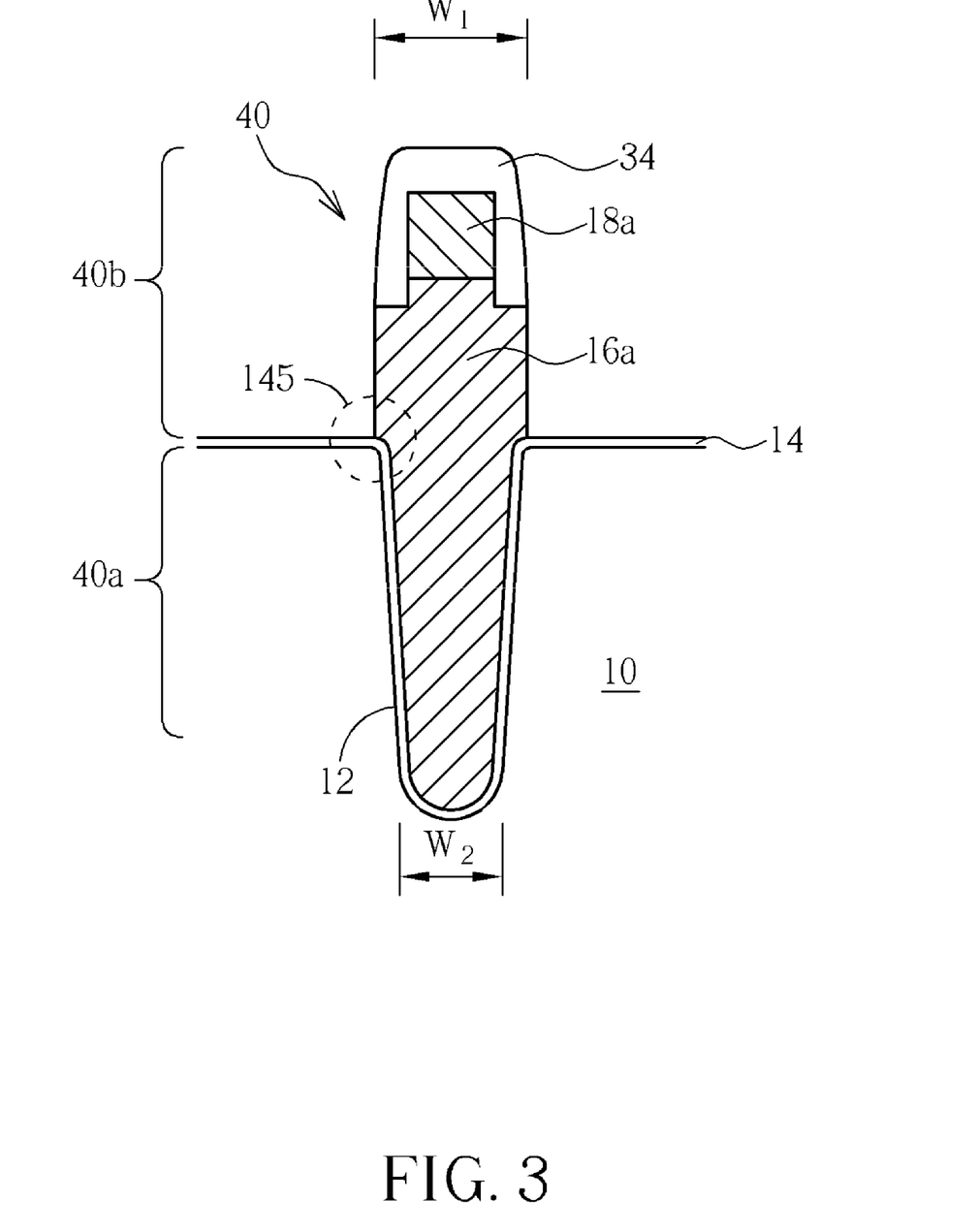
Figure 7:
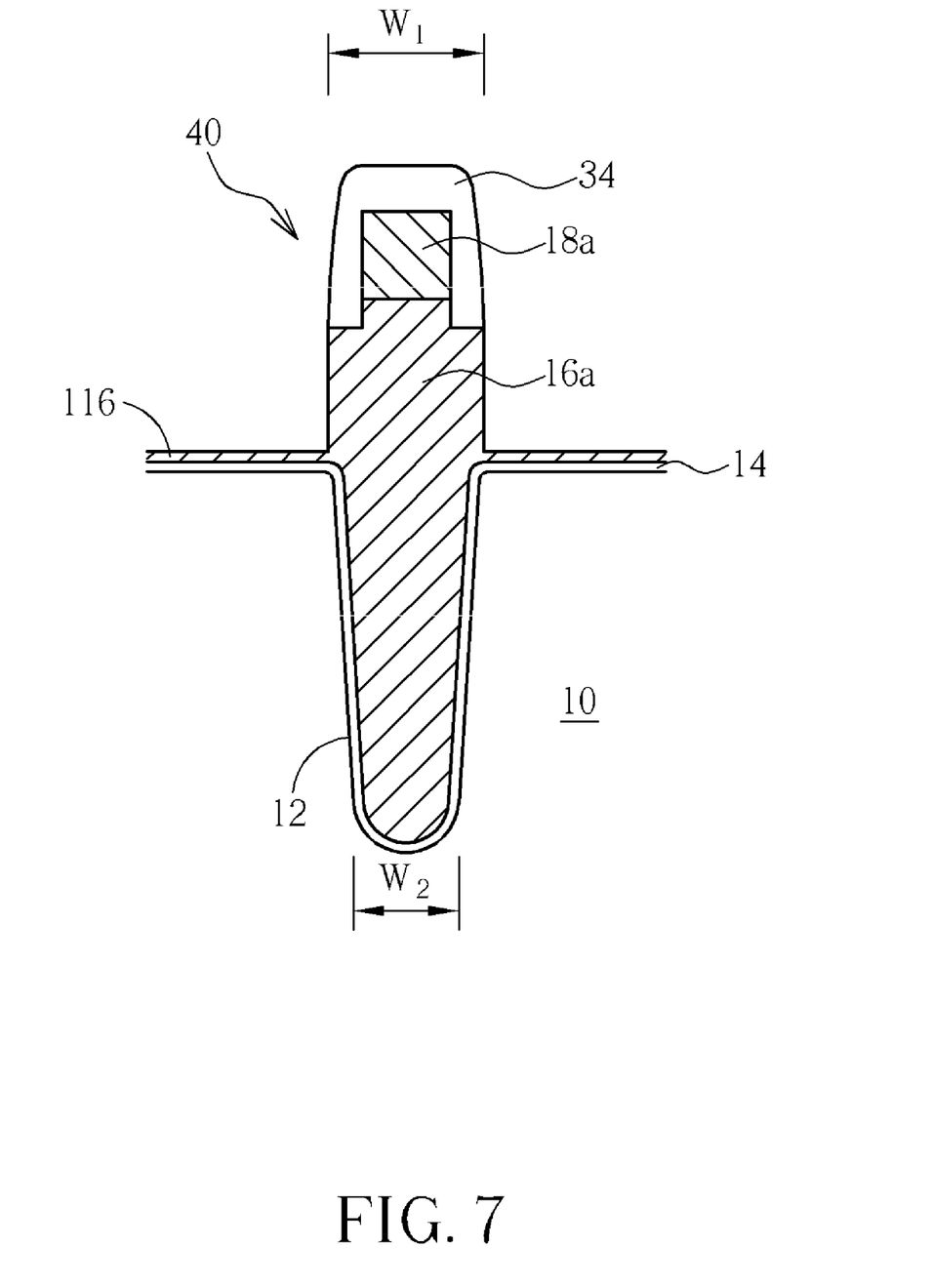
FIG. 7 illustrates another embodiment of this invention.

As shown in FIG. 3, the patterned photoresist mask 30 is stripped off. Thereafter, a dielectric cap 34 is formed on the patterned second layer 18a. According to the embodiment, the dielectric cap 34 may comprise silicon nitride. However, other materials may be employed. After forming the dielectric cap 34 on the patterned second layer 18a, an anisotropic dry etching process is carried out to etch the first layer 16 that is not masked by the dielectric cap 34, thereby forming a patterned first layer 16a. At this point, the patterned first layer 16, the patterned second layer 18 and the dielectric cap 34 constitute a recessed gate electrode 40. According to the embodiment, the anisotropic dry etching process stops upon the exposure of the gate dielectric layer 14. That is, the exposed portion of the first layer 16 that is not covered by the dielectric cap 34 is completely etched away. However, this is not necessary. In another embodiment, as shown in FIG. 7, a thin layer 116 of the first layer 16 is deliberately maintained on the gate dielectric layer 14 for the reliability concerns.

The recessed gate electrode 40 comprises a recessed gate portion 40a that is inlaid into the recess 12 and under the major surface 10a, and an upper gate portion 40b above the major surface 10a. At this point, the upper gate portion 40b has a width W1 that is slightly wider than the width W2 of the recessed gate portion 40a. The wider upper gate portion 40b creates a sharp polysilicon corner as indicated by the dotted circle denoted by numeral number 145. As previously mentioned, the sharp corner of the poly gate and the relative thinner gate oxide result in a concentrated electric field at the cell side corner. The concentrated electric field leads to the leakage. The invention method addresses this problem.

Figure 4:
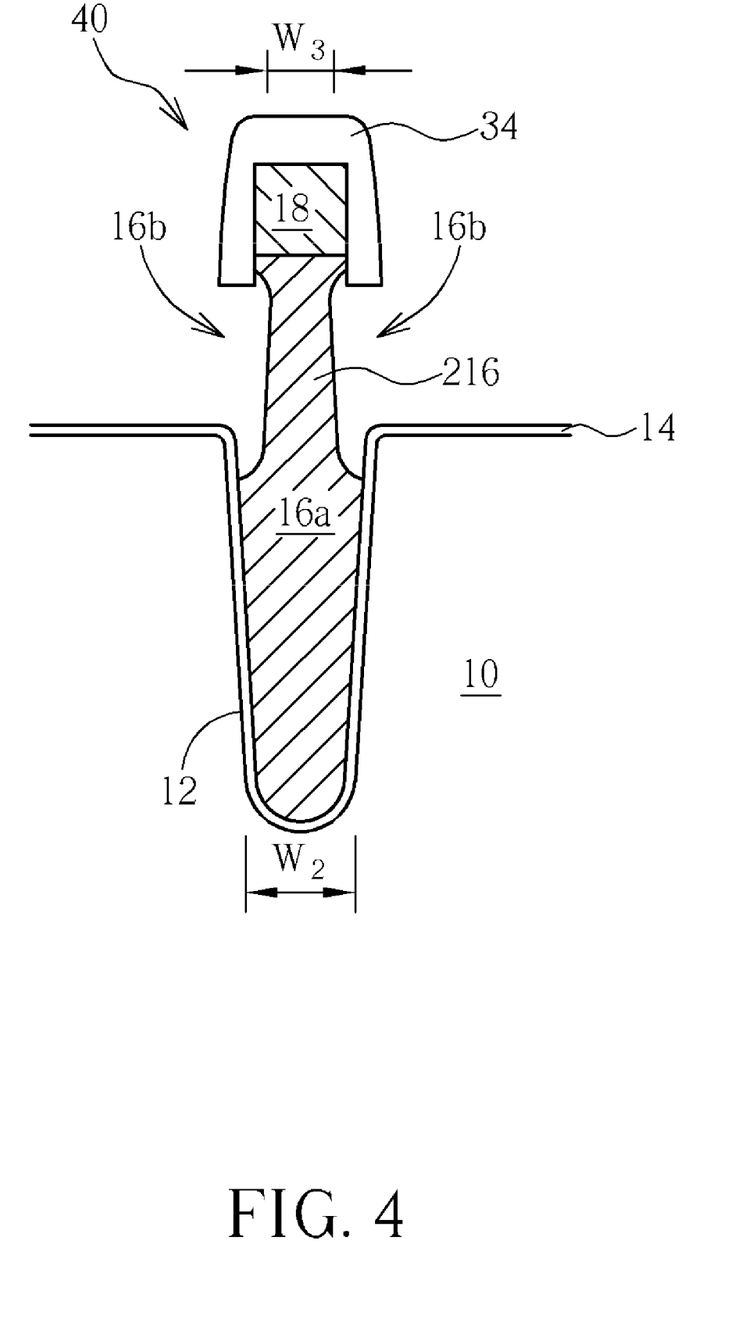

A shown in FIG. 4, after the formation of the recessed gate electrode 40, an isotropic etching process, such as a wet etching process employing NH4OH or tetramethylammonium hydroxide (TMAH), is performed to laterally etch the exposed sidewalls of the patterned first layer 16a of the recessed gate electrode 40, thereby forming recesses 16b in the patterned first layer 16a and a trimmed neck portion 216 having a width W3 that is smaller than the width W2 of the recessed gate portion 40a. At this point, the recessed gate electrode 40 has a mushroom shaped cross section. Since the patterned first layer 16a is etched by using isotropic etching process, the trimmed neck portion 216 may have a curved sidewall profile. According to the embodiment, for example, the etched portion of the patterned first layer 16a of the recessed gate electrode 40 on each side is about 5-8 nm thick, and the width w3 may range between 10-35 nm, preferably 20-30 nm. The isotropic etching process removes the sharp poly gate corner.

Figure 5:
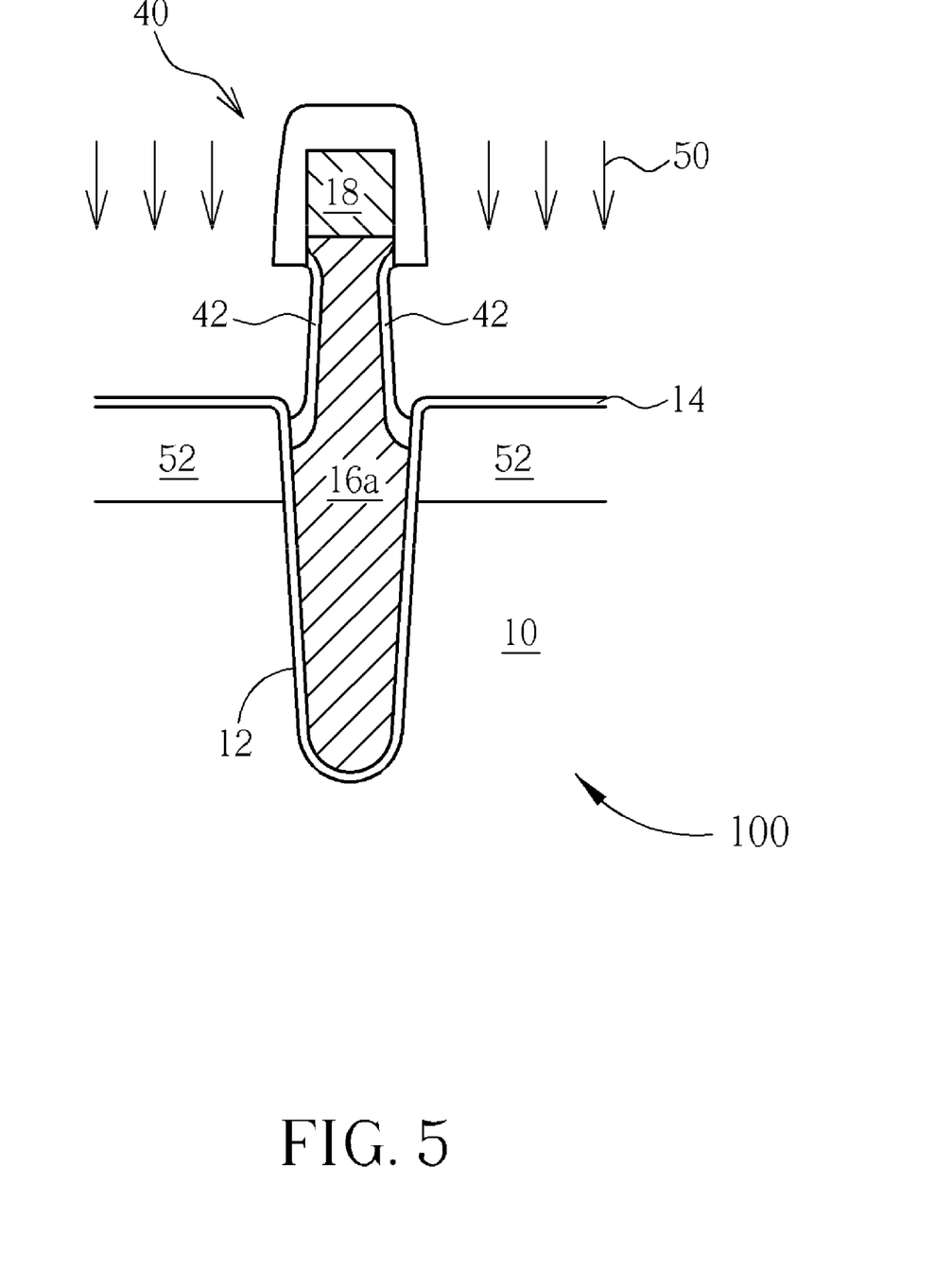

As shown in FIG. 5, subsequently, a thermal oxidation process is carried out to oxidize the exposed surface of the trimmed neck portion 216, thereby forming silicon oxide layer 42. The dielectric cap 34, the silicon oxide layer 42, and the gate dielectric layer 14 together encapsulate the patterned first layer 16a and the second layer 18a. After the formation of the silicon oxide layer 42, an ion implantation process 50 is then performed to implant dopants into the major surface 10a of the semiconductor substrate 10, thereby forming a source/drain doping region 52 on either side of the recessed gate electrode 40. The invention recessed gate electrode 40 and the recessed channel access transistor (RCAT) device 100 are now completed.

Figure 6:
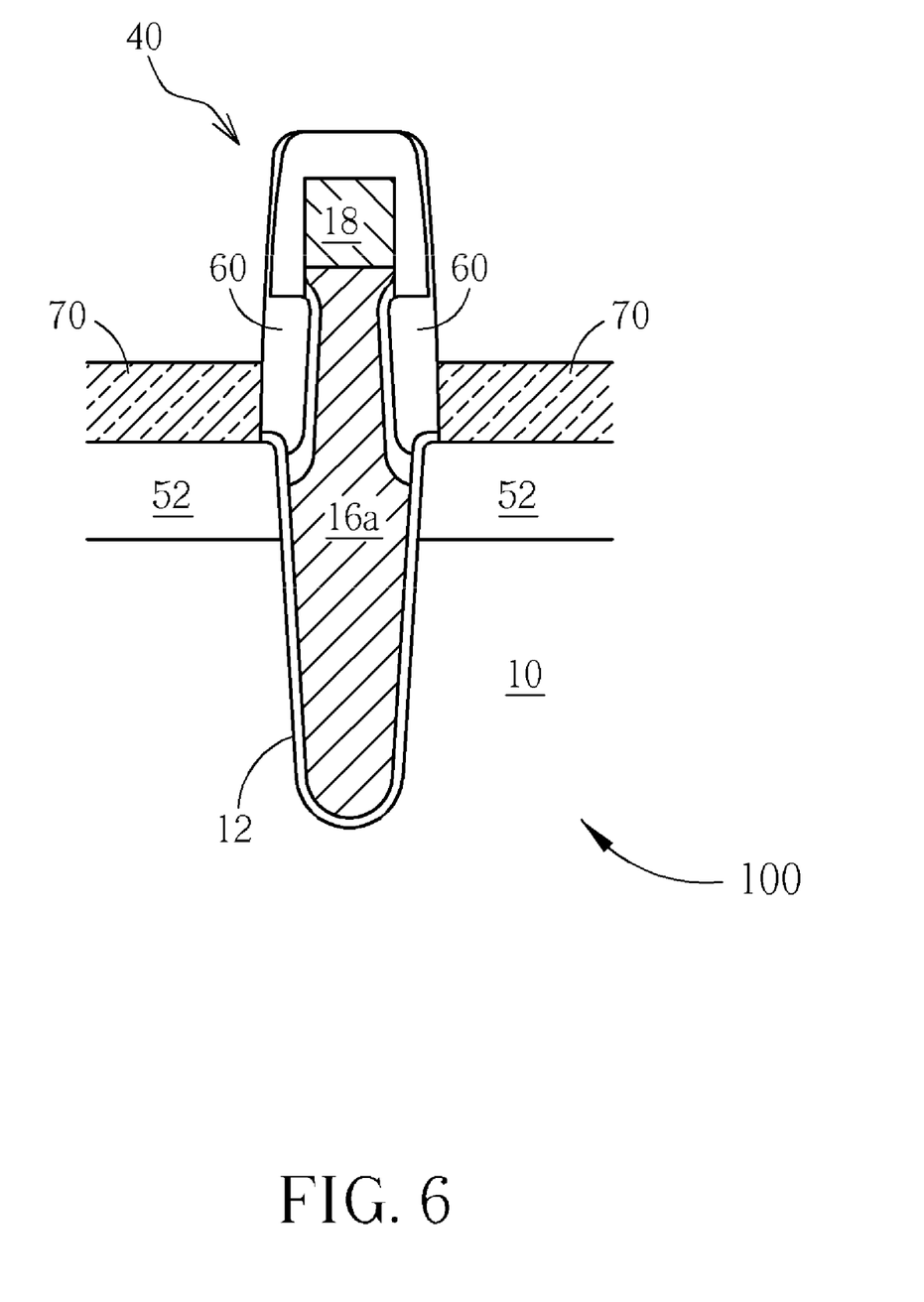

As shown in FIG. 6, optionally, a silicon nitride sidewall spacer 60 is formed on each sidewall of the recessed gate electrode 40. After the formation of the silicon nitride sidewall spacer 60, a cleaning process is performed to remove oxide such as remaining gate dielectric layer 14 or native oxide from the major surface 10a of the semiconductor substrate 10. Thereafter, an epitaxial silicon layer 70 is grown (or deposited) on the exposed major surface 10a of the semiconductor substrate 10 on the source/drain doping region 52.

Those skilled in the art will readily observe that numerous modifications and alterations of the device and method may be made while retaining the teachings of the invention.

What is claimed is:

1. A method of fabricating a recessed channel access transistor device, comprising:
   providing a semiconductor substrate having thereon a recess etched into a major surface of the semiconductor substrate;
   forming a gate dielectric layer on interior surface of the recess;
   forming a recessed gate electrode in and on the recess, wherein the recessed gate electrode comprises a recessed gate portion that is inlaid into the recess and under the major surface, and an upper gate portion above the major surface, wherein the upper gate portion comprises a patterned upper layer and a dielectric cap covering a sidewall and a top surface of the patterned upper layer;
   isotropically etching an exposed sidewall of the recessed gate electrode to thereby form a trimmed neck portion having a width that is smaller than that of the recessed gate portion; and
   oxidizing an exposed sidewall of the trimmed neck portion.

2. The method of fabricating a recessed channel access transistor device according to claim 1 wherein after oxidizing the exposed sidewall of the trimmed neck portion, the method further comprises:
   performing an ion implantation process to implant dopants into the major surface of the semiconductor substrate, thereby forming a source/drain doping region on either side of the recessed gate electrode.

3. The method of fabricating a recessed channel access transistor device according to claim 2 wherein after performing the ion implantation process, the method further comprises:
   forming a sidewall spacer on each sidewall of the recessed gate electrode.

4. The method of fabricating a recessed channel access transistor device according to claim 3 wherein after forming a sidewall spacer on each sidewall of the recessed gate electrode, the method further comprises:
   performing a cleaning process to remove oxide from the major surface of the semiconductor substrate; and
   growing an epitaxial silicon layer on the major surface of the semiconductor substrate.

5. The method of fabricating a recessed channel access transistor device according to claim 3 wherein the sidewall spacer is a silicon nitride sidewall spacer.

6. The method of fabricating a recessed channel access transistor device according to claim 1 wherein the width of the trimmed neck portion ranges between 10-35 nm.

7. The method of fabricating a recessed channel access transistor device according to claim 1 wherein the isotropically etching an exposed sidewall of the recessed gate electrode comprises use of NH4OH or tetramethylammonium hydroxide (TMAH).

\* \* \* \* \*